(12) United States Patent
Wang et al.

(10) Patent No.: US 11,454,845 B2
(45) Date of Patent: Sep. 27, 2022

(54) SURFACE LIGHT SOURCE, MANUFACTURING METHOD THEREOF AND LIQUID CRYSTAL DISPLAY DEVICE

(71) Applicants: BEIJING BOE DISPLAY TECHNOLOGY CO., LTD., Beijing (CN); BOE TECHNOLOGY GROUP CO., LTD., Beijing (CN)

(72) Inventors: Ruiyong Wang, Beijing (CN); Lianjie Qu, Beijing (CN); Yun Qiu, Beijing (CN); Hebin Zhao, Beijing (CN); Yang You, Beijing (CN); Jun Wu, Beijing (CN); Ruizhi Yang, Beijing (CN)

(73) Assignees: Beijing Boe Display Technology Co., Ltd., Beijing (CN); Beijing BOE Technology Development Co., Ltd., Beijing (CN)

( * ) Notice: Subject to any disclaimer, the term of this patent is extended or adjusted under 35 U.S.C. 154(b) by 9 days.

(21) Appl. No.: 16/632,589

(22) PCT Filed: Jun. 13, 2019

(86) PCT No.: PCT/CN2019/091117
§ 371 (c)(1),
(2) Date: Jan. 21, 2020

(87) PCT Pub. No.: WO2020/015485
PCT Pub. Date: Jan. 23, 2020

(65) Prior Publication Data
US 2021/0063822 A1    Mar. 4, 2021

(30) Foreign Application Priority Data

Jul. 20, 2018 (CN) .......................... 201810804521.0

(51) Int. Cl.
*G02F 1/13357* (2006.01)
*H05B 47/155* (2020.01)
(Continued)

(52) U.S. Cl.
CPC .. *G02F 1/133609* (2013.01); *G02F 1/133603* (2013.01); *G02F 1/133605* (2013.01);
(Continued)

(58) Field of Classification Search
CPC ......... G02F 1/133603; G02F 1/133605; H01L 25/0753; H01L 33/62
(Continued)

(56) References Cited

U.S. PATENT DOCUMENTS

| | | | |
|---|---|---|---|
| 2004/0164938 A1 | 8/2004 | Choi et al. | |
| 2006/0163596 A1* | 7/2006 | Kim ..................... | H05K 1/0203 257/98 |

(Continued)

FOREIGN PATENT DOCUMENTS

| | | |
|---|---|---|
| CN | 1811558 A | 8/2006 |
| CN | 2864333 Y | 1/2007 |

(Continued)

OTHER PUBLICATIONS

Chinese Office Action in Corresponding Patent Application No. 201810804521.0 dated May 22, 2020. 18 pages.

*Primary Examiner* — Christopher M Raabe
(74) *Attorney, Agent, or Firm* — Leason Ellis LLP

(57) ABSTRACT

A surface light source and a manufacturing method thereof and a liquid crystal display device. The surface light source includes a substrate; a plurality of light emitting diode dies arranged in an array along a row direction and a column direction on the substrate; a driving circuit on the substrate and electrically connected to the plurality of light emitting diode dies and the driving circuit being configured to control (Continued)

at least two of the plurality of light emitting diode dies to emit light independently of each other; and an encapsulation layer on a side of the plurality of light emitting diode dies away from the substrate. The encapsulation layer is a continuous film layer covering the plurality of light emitting diode dies.

13 Claims, 3 Drawing Sheets

(51) Int. Cl.
  *H01L 25/075*    (2006.01)
  *H01L 33/54*    (2010.01)
  *H01L 33/60*    (2010.01)
  *H01L 33/62*    (2010.01)
  *G02F 1/1335*    (2006.01)

(52) U.S. Cl.
  CPC .... *G02F 1/133621* (2013.01); *H01L 25/0753* (2013.01); *H01L 33/54* (2013.01); *H01L 33/60* (2013.01); *H01L 33/62* (2013.01); *H05B 47/155* (2020.01); *G02F 1/133612* (2021.01); *H01L 2933/005* (2013.01); *H01L 2933/0058* (2013.01); *H01L 2933/0066* (2013.01)

(58) Field of Classification Search
  USPC .......................................................... 349/69
  See application file for complete search history.

(56) References Cited

U.S. PATENT DOCUMENTS

| | | | |
|---|---|---|---|
| 2011/0068709 A1* | 3/2011 | Ing | H05K 1/142 |
| | | | 315/294 |
| 2011/0211334 A1* | 9/2011 | Kim | H01L 33/507 |
| | | | 362/84 |
| 2013/0207136 A1 | 8/2013 | Cheng et al. | |
| 2014/0085344 A1* | 3/2014 | Jung | G02B 6/0078 |
| | | | 345/690 |
| 2014/0346545 A1* | 11/2014 | Chan | H01L 33/58 |
| | | | 257/98 |
| 2015/0206819 A1* | 7/2015 | Ichiryu | H01L 24/96 |
| | | | 257/774 |
| 2016/0379560 A1 | 12/2016 | Cho | |
| 2017/0030569 A1* | 2/2017 | Lin | H05K 1/0203 |
| 2017/0263826 A1* | 9/2017 | Huska | H01L 33/501 |
| 2017/0309793 A1* | 10/2017 | Seo | H01L 33/508 |
| 2018/0190185 A1 | 7/2018 | Ko et al. | |
| 2018/0341152 A1* | 11/2018 | Yamashita | H01L 33/62 |
| 2019/0285950 A1* | 9/2019 | Liu | H05K 1/181 |
| 2019/0294004 A1* | 9/2019 | Hashimoto | H01L 33/507 |
| 2019/0326268 A1* | 10/2019 | Tseng | H01L 27/1255 |
| 2020/0044121 A1* | 2/2020 | Imada | G02F 1/133603 |
| 2020/0074917 A1* | 3/2020 | Li | G09G 3/3426 |

FOREIGN PATENT DOCUMENTS

| | | |
|---|---|---|
| CN | 101493206 A | 7/2009 |
| CN | 101761810 A | 6/2010 |
| CN | 202165891 U | 3/2012 |
| CN | 104584208 A | 4/2015 |
| CN | 105161431 A | 12/2015 |
| CN | 105867028 A | 8/2016 |
| CN | 206209253 U | 5/2017 |
| CN | 106940493 A | 7/2017 |
| CN | 206802950 U | 12/2017 |
| CN | 207096637 U | 3/2018 |
| CN | 108803149 A | 11/2018 |

\* cited by examiner

SURFACE LIGHT SOURCE, MANUFACTURING METHOD THEREOF AND LIQUID CRYSTAL DISPLAY DEVICE

CROSS-REFERENCE TO RELATED PATENT APPLICATIONS

The application is a U.S. National Stage Application under 35 U.S.C. § 371 of International Patent Application No. PCT/CN2019/091117, filed Jun. 13, 2019, which claims priority of China Patent application No. 201810804521.0 filed on Jul. 20, 2018, both of which are incorporated by reference in their entireties as portion of the present application.

TECHNICAL FIELD

At least one embodiment of the present disclosure relates to a surface light source and a manufacturing method thereof, and a liquid crystal display device.

BACKGROUND

Backlight sources using light emitting diodes (LED) are mainly divided into two types: an edge-lit type and a direct illumination-type, and traditional direct illumination-type backlights generally use a plurality of LED lamp beads disposed on a circuit board and independent lenses for secondary light distribution to realize light mixing.

SUMMARY

At least one embodiment of the present disclosure provides a surface light source and a manufacturing method thereof, and a liquid crystal display device.

At least one embodiment of the present disclosure provides a surface light source, comprising: a substrate; a plurality of light emitting diode dies arranged in an array along a row direction and a column direction on the substrate; a driving circuit on the substrate and electrically connected to the plurality of light emitting diode dies, and the driving circuit being configured to control at least two of the plurality of light emitting diode dies to emit light independently of each other; an encapsulation layer on a side of the plurality of light emitting diode dies away from the substrate, wherein the encapsulation layer is a continuous film layer covering the plurality of light emitting diode dies.

In some examples, the encapsulation layer is in direct contact with the plurality of light emitting diode dies.

In some examples, the plurality of light emitting diode dies comprise a plurality of red light dies, a plurality of green light dies and a plurality of blue light dies, and the plurality of red light dies, the plurality of green light dies and the plurality of blue light dies are uniformly distributed to emit white light.

In some examples, in a direction of at least one of the row direction and the column direction, a distance between adjacent ones of the plurality of light emitting diode dies is in a range of 15 µm to 3000 µm.

In some examples, in the direction of at least one of the row direction and the column direction, the distance between adjacent ones of the plurality of light emitting diode dies is in a range of 30 µm to 500 µm.

In some examples, in a direction perpendicular to the substrate, a thickness of the encapsulation layer on the side of the plurality of light emitting diode dies away from the substrate is in a range of 10 µm to 1000 µm.

In some examples, in the direction perpendicular to the substrate, the thickness of the encapsulation layer on the side of the plurality of light emitting diode dies away from the substrate is less than 30 µm.

In some examples, the substrate is a glass substrate.

In some examples, each of the plurality of light emitting diode dies comprises pins, and the driving circuit comprises pads, the surface light source further comprises: a buffer layer between the substrate and the plurality of light emitting diode dies, wherein the buffer layer comprises a plurality of openings configured to expose the pads, and the pins of each of the plurality of light emitting diode dies are configured to be inserted into the plurality of openings so as to be electrically connected with the pads.

In some examples, a size of each of the plurality of light emitting diode dies in one of the row direction and the column direction is in a range of 30 µm to 200 µm, and a size of each of the plurality of light emitting diode dies in the other one of the row direction and the column direction is in a range of 30 µm to 600 µm.

In some examples, the surface light source further comprises: a reflective layer on a side of the plurality of light emitting diode dies facing the substrate, so that light emitted by the plurality of light emitting diode dies exits to the side of the plurality of light emitting diode dies away from the substrate.

In some examples, the driving circuit is configured to control each of the plurality of light emitting diode dies to emit light independently; or, the plurality of light emitting diode dies comprise a plurality of die groups arranged in the row direction and the column direction, and the driving circuit is configured to control each of the plurality of die groups to emit light independently.

At least one embodiment of the disclosure provides a liquid crystal display device, comprising: the surface light source according to any embodiments as mentioned above; and a display panel on a light exiting side of the surface light source, wherein the display panel comprises an array substrate and an opposing substrate which are oppositely arranged, and the surface light source is on a side of the array substrate away from the opposing substrate.

At least one embodiment of the disclosure provides a manufacturing method of a surface light source, comprising: forming a driving circuit on a substrate; disposing a plurality of light emitting diode dies on a side of the substrate on which the driving circuit is formed, wherein the plurality of light emitting diode dies are electrically connected to the driving circuit, and the driving circuit is configured to control at least two of the plurality of light emitting diode dies to emit light independently of each other; and forming an encapsulation layer on a side of the plurality of light emitting diode dies away from the substrate, wherein the encapsulation layer is a continuous film layer covering the plurality of light emitting diode dies.

In some examples, the driving circuit comprises pads, each of the plurality of light emitting diode dies comprises pins, before disposing the plurality of light emitting diode dies, the manufacturing method further comprises: forming a buffer layer on the side of the substrate on which the driving circuit is formed; forming a plurality of openings in the buffer layer, the plurality of the openings being configured to expose the pads between the buffer layer and the substrate; forming adhesive units adhered to the pads in the plurality of openings; disposing the plurality of light emitting diode dies comprises: inserting the pins of each of the plurality of light emitting diode dies into the plurality of openings so as to be adhered to the adhesive units.

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

DETAILED DESCRIPTION

Figure 1A:
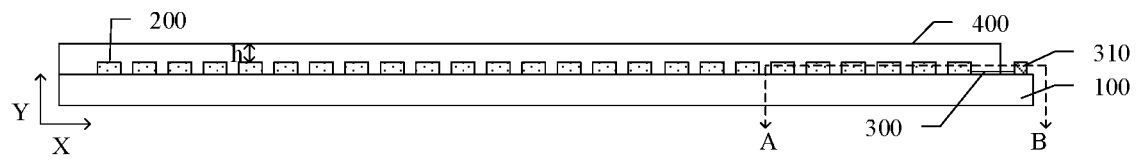
FIG. 1A is a sectional view of a surface light source provided by an embodiment of the present disclosure.

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the disclosure. Based on the described embodiments herein, one person skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present invention belongs. The terms "first," "second," and so on which are used in the description and the claims of the present application for invention, are not intended to indicate any sequence, amount or importance, but distinguish various components. The terms "comprises," "comprising," "includes," "including," etc., are intended to specify that the elements or the objects stated before these terms encompass the elements or the objects and equivalents thereof listed after these terms, but do not preclude the other elements or objects.

In the research, the inventors of the present application found that: the traditional backlight including light emitting diode (LED) lamp beads needs a large light mixing distance, resulting in a large thickness of the entire display module using the backlight.

At least one embodiment of the present disclosure provides a surface light source and a manufacturing method thereof, and a liquid crystal display device. The surface light source includes: a substrate; a plurality of light emitting diode dies on the substrate, the plurality of light emitting diode dies being arranged in an array along a row direction and a column direction; a driving circuit on the substrate, electrically connected to the plurality of light emitting diode dies, and the driving circuit being configured to control at least two of the plurality of light emitting diode dies to emit light independently of each other; and an encapsulation layer, located on a side of the plurality of light emitting diode dies away from the substrate. The encapsulation layer is a continuous film layer covering the plurality of light emitting diode dies. On one hand, the plurality of light emitting diode dies in the present disclosure can realize an effect of a surface light source and can reduce a light mixing distance of the surface light source; on the other hand, the driving circuit connected with the light emitting diode dies can control the light emitting diode dies to realize dynamic light emission.

Hereinafter, the surface light source and the manufacturing method thereof, and the liquid crystal display device in embodiments of the present disclosure will be described below with reference to the drawings.

Figure 1B:
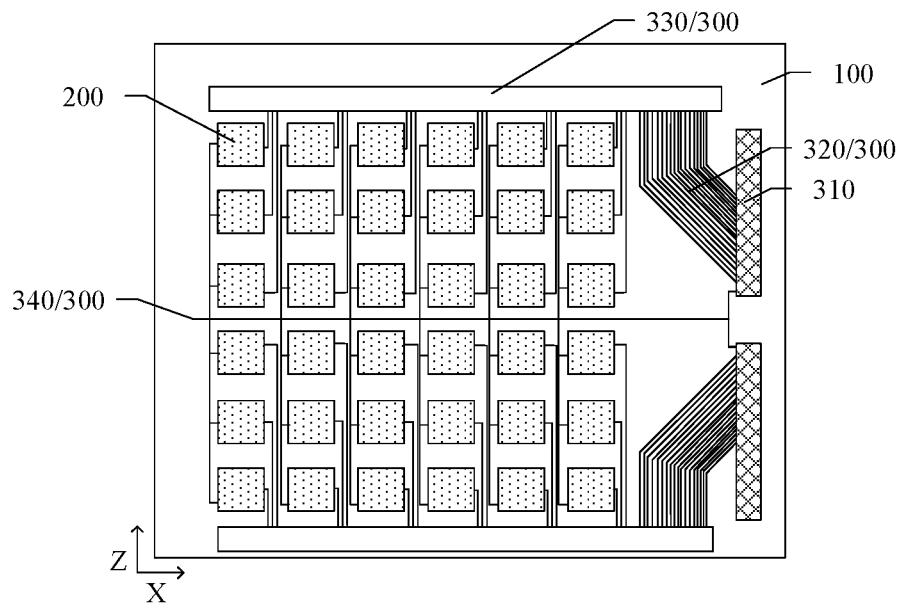
FIG. 1B is a partial plan view of a part of the surface light source corresponding to line AB as illustrated in FIG. 1A.

An embodiment of the present disclosure provides a surface light source. FIG. 1A illustrates a sectional view of the surface light source provided by the embodiment, FIG. 1B is a partial plan view of a part of the surface light source corresponding to line AB illustrated in FIG. 1A. As illustrated in FIG. 1A and FIG. 1B, the surface light source provided by the present embodiment includes a substrate 100, a plurality of light emitting diode dies 200 and a driving circuit 300 located on the substrate 100, and an encapsulation layer 400 on a side of the plurality of light emitting diode dies 200 away from the substrate 100. The encapsulation layer 400 is a continuous film layer covering the plurality of light emitting diode dies 200. In the embodiment of the present disclosure, the plurality of light emitting diode dies 200 are arranged in an array along a row direction and a column direction, that is, the plurality of light emitting diode dies 200 are arranged in an array along X direction and Z direction illustrated in figures; the driving circuit 300 is electrically connected to the plurality of light emitting diode dies 200, and configured to control at least two of the plurality of light emitting diode dies 200 to emit light independently of each other.

In at least one embodiment of the present disclosure, the light emitting diode dies are unpackaged dies, and the continuous film layer covering the plurality of light emitting diode dies 200 is used as the encapsulation layer 400 which is in direct contact with the surface of the light emitting diode dies 200, which can not only protect the light emitting diode dies 200 from physical damage such as external force impact, but also prevent sulfur and sulfide in the air from corroding the light emitting diode dies 200, so as to prolong the service life of the light emitting diode dies 200. FIG. 1A takes an example that a surface of the encapsulation layer 400 away from the substrate 100 is a plane, but in an actual process, the surface of the encapsulation layer 400 away from the substrate 100 may be an uneven surface, the present embodiment is not limited thereto.

For example, a material of the encapsulation layer 400 can include epoxy resin, and the present embodiment includes but is not limited thereto.

For example, as illustrated in FIG. 1A and FIG. 1B, a size of each light emitting diode die 200 in one of the row direction and the column direction is in a range of 30 μm to 200 μm, and a size of each light emitting diode die 200 in the other one of the row direction and the column direction is in a range of 30 µm to 600 µm. That is, each light emitting diode die can be a micro LED die or a mini LED die.

For example, as illustrated in FIG. 1A and FIG. 1B, in at least one of the row direction and the column direction, a distance between adjacent light emitting diode dies 200 is in a range of 15 µm to 3000 µm. For example, in at least one of the row direction and the column direction, the distance between adjacent light emitting diode dies 200 is in a range of 30 µm to 2500 µm. For example, in at least one of the row direction and the column direction, the distance between adjacent light emitting diode dies 200 is in a range of 30 µm to 500 µm. For example, in at least one of the row direction and the column direction, the distance between adjacent light emitting diode dies 200 is in a range of 150 µm to 300 µm. The distance between the unpackaged light emitting diode dies 200 in the embodiment is much smaller than a distance between packaged light emitting diode lamp beads, and the smaller distance between adjacent light emitting diode dies 200 can ensure that the plurality of light emitting diode dies 200 form a surface light source.

For example, the plurality of light emitting diode dies 200 may include a plurality of red light dies, a plurality of green light dies and a plurality of blue light dies, and the plurality of red light dies, the plurality of green light dies and the plurality of blue light dies are uniformly distributed. That is, the dies for generating light of different colors included in the plurality of light emitting diode dies 200 are alternately arranged so that the dies for generating light of each color are uniformly distributed on the substrate 100. In the embodiment, the distance between adjacent light emitting diode dies 200 is relatively small, so that light of different colors emitted by the plurality of light emitting diode dies 200 can be mixed and emitted as white light.

For example, a material of the red light die may include indium gallium aluminum phosphide (AlGaInP) or aluminum gallium arsenide (AlGaAs), ect.; a material of the green light die may include indium gallium nitride (InGaN) or indium gallium nitride/gallium nitride (InGaN/GaN), etc.; a material of the blue light die may include gallium nitride (GaN), etc., the embodiment is not limited thereto. The plurality of light emitting diode dies can further include dies of other colors as long as white light can be formed after mixing.

For example, as illustrated in FIG. 1A, in a direction perpendicular to the substrate 100, that is Y direction illustrated in FIG. 1A, the encapsulation layer 400 on the side of the light emitting diode dies 200 away from the substrate 100 has a thickness h in a range of 10 µm to 1000 µm. For example, in Y direction, the thickness of the encapsulation layer 400 directly above the light emitting diode die 200 is in a range of 10 µm to 1000 µm. For example, in the direction perpendicular to the substrate 100, the encapsulation layer 400 on the side of the light emitting diode dies 200 away from the substrate 100 has the thickness h in a range of 10 µm to 100 µm.

For example, in the direction perpendicular to the substrate 100, the thickness h of the encapsulation layer 400 on the side of the light emitting diode dies 200 away from the substrate 100 is less than 30 µm. For example, in Y direction, the thickness of the encapsulation layer 400 directly above the light emitting diode die 200 is less than 30 µm. For example, in the direction perpendicular to the substrate 100, the thickness h of the encapsulation layer 400 on the side of the light emitting diode dies 200 away from the substrate 100 is in a range of 10 µm to 15 µm. In the embodiment, the thickness of the encapsulation layer on the side of the light emitting diode die away from the substrate is relatively small, so that the thickness of the surface light source can be reduced.

For example, as illustrated in FIG. 1A, the substrate 100 is a glass substrate. For example, the glass substrate may be alkali-free glass or sapphire glass or the like, the embodiment of the present disclosure is not limited thereto.

For example, the glass substrate has a thickness in a range of 0.1 mm to 1 mm in Y direction, the embodiment includes but is not limited thereto.

For example, as illustrated in FIG. 1A and FIG. 1B, the driving circuit 300 can be directly disposed on the substrate 100, that is, the surface light source of the embodiment can replace a general circuit board with the glass substrate.

For example, as illustrated in FIG. 1B, the driving circuit 300 is electrically connected to an integrated circuit controller 310. The drive circuit 300 includes traces 320 electrically connected to the integrated circuit controller 310, and at least a portion of the traces 320 is located in a trace region 330. The integrated circuit controller 310 is respectively electrically connected to each light emitting diode die 200 through a plurality of traces 320 to control each light emitting diode die 200 to emit light independently.

For example, the driving circuit 300 further includes common electrode lines 340 electrically connected to the integrated circuit controller 310, the common electrode lines 340 are connected to each light emitting diode die 200. For example, the light emitting diode die 200 includes a cathode and an anode, and the common electrode line 340 may be connected to the cathode of each light emitting diode die 200, for example, the cathodes of the light emitting diode dies 200 may be a common cathode, the embodiment is not limited thereto. For example, the common electrode line 340 may be connected to the anode of each light emitting diode die 200, for example, the anodes of the light emitting diode dies 200 may be a common anode.

For example, as illustrated in FIG. 1A and FIG. 1B, the encapsulation layer 400 may not cover the integrated circuit controller 310, but only cover the driver circuit 300, the embodiment includes but is not limited thereto.

For example, materials of various traces and electrode lines included in the driving circuit 300 include metal, for example, the metal can be one of aluminum, molybdenum, copper or silver, or alloys thereof, the embodiment includes but is not limited thereto.

For example, the driving circuit 300 can also include a thin film transistor circuit (not illustrated in figures), the thin film transistor circuit can be connected to the light emitting diode dies. The present embodiment can realize independent control of each light emitting diode die in a time-sharing driving manner.

Figure 1C:
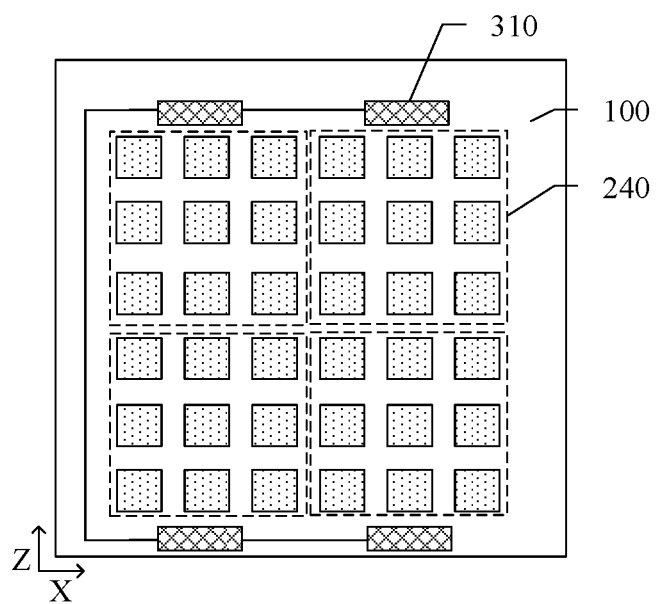
FIG. 1C is a partial plan view of a surface light source provided by another example of an embodiment of the present disclosure.

For example, FIG. 1C is a partial plan view of a surface light source provided by another example of an embodiment of the present disclosure. As illustrated in FIG. 1C, the driving circuit 300 can be electrically connected to a plurality of integrated circuit controllers 310. Each integrated circuit controller 310 may be connected through signal lines such as power lines, clock lines, input/output lines (I/O lines) and the like to control the operation timing of each integrated circuit controller 310. The plurality of light emitting diode dies include a plurality of die groups 240 arranged in the row direction and the column direction, and each integrated circuit controller 310 is electrically connected to one die group 240 to control each die group 240 to emit light independently. The embodiment is not limited thereto, for example, the integrated circuit controller 310 electrically connected to each die group 240 can control each light emitting diode die in the die groups 240 to emit light independently. The arrangement illustrated in FIG. 1C can reduce the number of light emitting diode dies driven by each integrated circuit controller, so as to reduce the energy loss on the drive signal line. In addition, in a case where the surface light source in the example is used as a backlight source of a display device, such modular arrangement can facilitate splicing of a plurality of surface light sources, thereby realizing display of a larger size.

Figure 2:
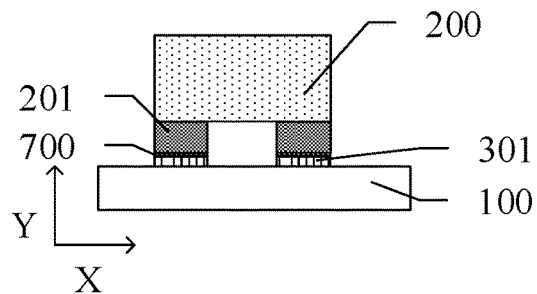
FIG. 2 is a view of a light emitting diode die adhered to a substrate provided by an embodiment of the present disclosure.

For example, FIG. 2 is a view of a light emitting diode die adhered to a substrate. As illustrated in FIG. 2, each light emitting diode die 200 includes pins 201, a size of the pin 201 in X direction or Z direction can be in a range of 1 μm to 200 μm, a thickness of the pin 201 in a direction perpendicular to the substrate 100 (that is Y direction) can be a range of 0.5 μm to 100 μm, the embodiment includes but is not limited thereto.

For example, as illustrated in FIG. 2, the driving circuit includes pads 301, the pin 201 of the light emitting diode die 200 can be electrically connected with the pad 301 of the driving circuit through an adhesive unit 700, or, the pin 201 of the light emitting diode die 200 may also be electrically connected to the pad 301 of the drive circuit in a eutectic manner.

For example, a material of the pad 301 included in the driving circuit and a material of the pin 201 of the light emitting diode die 200 can include one selected from the group consisting of copper, tin, gold and alloy thereof, the embodiment includes but is not limited thereto.

For example, the pad 301 included in the driving circuit and the pin 201 of the light emitting diode die 200 can be adhered by eutectic soldering to fix the light emitting diode die 200. Eutectic refers to a phenomenon of eutectic fusion of eutectic solder at relatively low temperature. Eutectic alloy changes directly from solid state to liquid state without going through plastic stage. Eutectic is an equilibrium reaction in which one liquid state generates two solid states simultaneously. For example, the eutectic solder may include copper and tin.

For example, the adhesive unit 700 can include solder paste or flux or the like to adhere and electrically connect the pin 201 of the light emitting diode die 200 and the pad 302 of the driving circuit. For example, the adhesive unit 700 can be disposed on the pad 301 by dispensing or screen printing, the embodiment includes but is not limited thereto.

For example, the light emitting diode die 200 can be of flip chip. Flip chip refers to a chip in which a forward-facing light emitting diode chip is inverted and soldered on a substrate, so that most of the heat is led out through the substrate instead of through the sapphire growth substrate with poor heat dissipation, which alleviates the heat dissipation problem of the light emitting diode die to a certain extent. A light exiting surface and a pin surface of the flip chip are two surfaces with opposite direction, so that the influence of the pin of the light emitting diode die on a light emitting area of the light emitting diode die is avoided, and the light emitting area of the flip chip is larger and the light emitting efficiency is higher. The embodiment is not limited thereto, the light emitting diode die can also be a normal chip or a vertical chip.

Figure 3A:
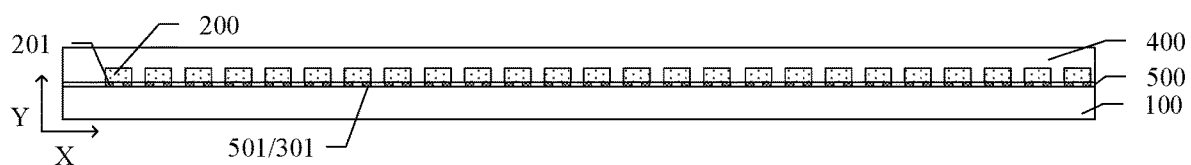
FIG. 3A is a sectional view of a surface light source provided by another embodiment of the present disclosure.
Figure 3B:
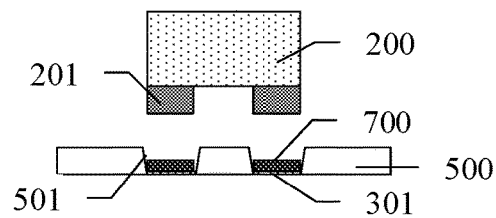
FIG. 3B is an enlarged view of a partial structure in FIG. 3A.

For example, FIG. 3A is a sectional view of a surface light source provided by another embodiment of the present disclosure, and FIG. 3B is an enlarged view of a partial structure in FIG. 3A. As illustrated in FIG. 3A and FIG. 3B, the surface light source further includes a buffer layer 500 located between the substrate 100 and the light emitting diode dies 200, the buffer layer 500 includes a plurality of openings 501 configured to expose the pads 301, so that the pins 201 of each light emitting diode die 200 are inserted into the plurality of openings 501 so as to be electrically connected with the pads 301. For example, the pins 201 of the light emitting diode dies 200 inserted into the openings 501 can be adhered to the pads 301 through the adhesive unit 700. According to the embodiment, by arranging the buffer layer with the openings on the substrate, the light emitting diode dies can be accurately placed, and the problem that the light emitting diode dies move after being placed on the substrate can be solved. In the embodiment, the placement error of the light emitting diode die is determined by the opening process of the buffer layer (e.g., photolithography process). As the precision of the photolithography process greatly exceeds the placement precision of the manipulator, the buffer layer provided with the opening in the embodiment can improve the placement precision of the light emitting diode die compared with the way in which the manipulator is used to place the light emitting diode die.

For example, in the embodiment, the glass substrate 100 can be compatible with the process of preparing the buffer layer 500.

For example, as illustrated in FIG. 3A and FIG. 3B, a thickness of the buffer layer 500 in a direction perpendicular to the substrate 100 is in a range of 0.5 μm to 1000 μm. For example, the thickness of the buffer layer 500 in the direction perpendicular to the substrate 100 is in a range of 50 μm to 200 μm. For example, the thickness of the buffer layer 500 in the direction perpendicular to the substrate 100 is in a range of 5 μm to 10 μm so that the thickness of the surface light source is smaller. It should be noted that, in the direction perpendicular to the substrate, the thickness of the pad of the driving circuit is smaller than a depth of the opening to ensure that the pin of the light emitting diode die need to be inserted into the opening to be electrically connected with the pad.

For example, a material of the buffer layer 500 may be a mixture of organic substances such as propyl acetate or siloxane and photo-initiator, so that the opening 501 may be made in the buffer layer 500 by photolithography process.

For example, as illustrated in FIG. 3A and FIG. 3B, in a direction parallel to the substrate 100, a size of the opening 501 is greater than a size of the pin 201 so that the pin 201 can be inserted into the opening 501 so as to be electrically connected with the pad 301.

For example, as illustrated in FIG. 3B, a sectional shape of the opening 501 may include an inverted trapezoid.

Figure 4:
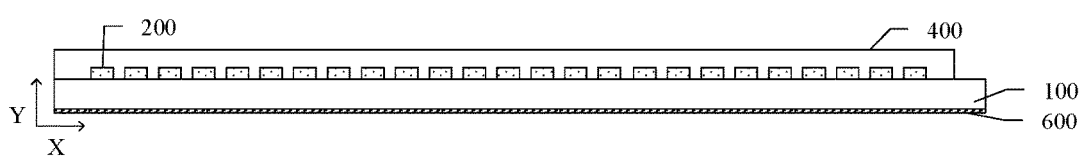
FIG. 4 is a sectional view of a surface light source provided by another embodiment of the present disclosure.

For example, FIG. 4 is a sectional view of a surface light source provided by another embodiment of the present disclosure. As illustrated in FIG. 4, the surface light source further includes a reflective layer 600, the reflective layer 600 is on a side of the light emitting diode die 200 facing the substrate 100, so that light emitted by the light emitting diode die exits to the side of the light emitting diode die away from the substrate.

For example, because the light emitting diode die 200 is not packaged and its emitting surface is nearly spherical, in order to improve the light efficiency utilization rate of the light emitting diode die 200, the reflective layer 600 may be provided on the side of the substrate 100 away from the light emitting diode die 200.

For example, the reflective layer 600 may be a metal layer including materials such as silver/molybdenum or silver, or the reflective layer 600 may be a reflective layer including inorganic particles, or the reflective layer 600 may be a silver mirror reflective layer prepared by a silver ammonia solution, and etc., and the embodiment includes but is not limited thereto.

The reflective layer 600 on the side of the light emitting diode die 200 facing the substrate 100 in the embodiment enables that the light emitted from the light emitting diode die 200 to the reflective layer 600 can be reused after being reflected, thereby effectively utilizing the light emitted from the light emitting diode die 200. Compared with a case where no reflective layer is provided, the reflective layer 600 in the surface light source provided by the embodiment can increase the light utilization rate by at least 20%~35%.

Figure 5A:
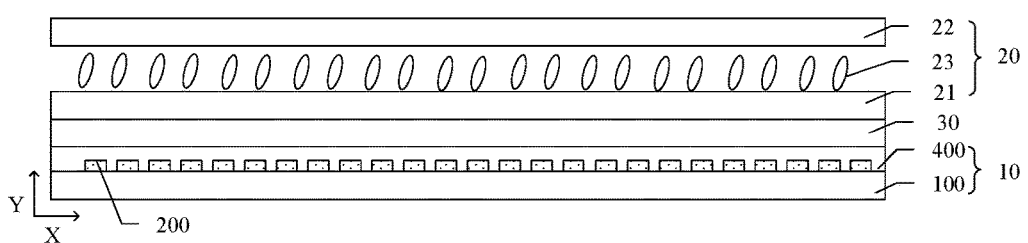
FIG. 5A is a partial structural view of a liquid crystal display device provided by an embodiment of the present disclosure.

Another embodiment of the present disclosure provides a liquid crystal display device. FIG. 5A is a partial structural view of a liquid crystal display device provided by an embodiment of the present disclosure. As illustrated in FIG. 5A, the liquid crystal display device includes the surface light source 10 provided by any embodiment as mentioned above and a display panel 20 on a light exit side of the surface light source 10. The display panel 20 includes an array substrate 21 and an opposing substrate 22 which are oppositely arranged, and the surface light source 10 is on a side of the array substrate 21 away from the opposing substrate 22.

For example, the opposing substrate 22 may be a color film substrate, and a liquid crystal layer 23 is further included between the array substrate 21 and the color film substrate.

For example, the liquid crystal display device further includes a backlight film portion 30 between the surface light source 10 and the display panel 20. The backlight film portion 30 includes an adhesive tape for adhering the surface light source 10 to the display panel 20, and a light adjusting structure (not illustrated in figures) for realizing uniform light extraction from the surface light source 10.

For example, the light adjusting structure can include a diffusion film. For example, the diffusion film may include a polymer substrate with high transmittance and scattering particles (such as titanium dioxide, etc.) doped in the polymer substrate. For example, the diffusion film may also be a laminated structure of a multilayer film. Light passing through the diffusion film will be scattered by scattering particles therein, so as to make the observer perceive that the light is a brightness distribution directly provided by a surface of the diffusion film.

For example, the light adjusting structure may further include a prism film disposed on a side of the diffusion film away from the surface light source. For example, the prism film may be formed by laminating a prism layer having a sharp-angle micro-prism structure and a substrate layer, and is configured to concentrate light of a large angle to a small angle to increase viewing brightness in a positive viewing angle.

For example, the light adjusting structure further includes a reflective polarizing plate to improve light efficiency.

For example, the light adjusting structure may further include a filter to improve the color gamut of the liquid crystal display device.

Figure 5B:
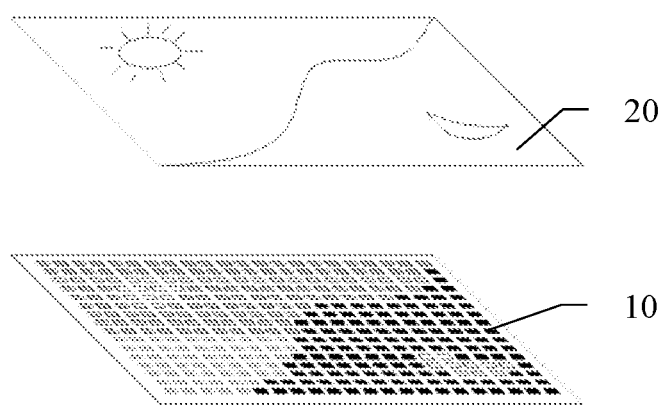
FIG. 5B is a view of a liquid crystal display device upon displaying illustrated in FIG. 5A.

For example, FIG. 5B is a view of a liquid crystal display device upon displaying illustrated in FIG. 5A. As illustrated in FIG. 5B, as the backlight of the liquid crystal display device, the surface light source 10 can realize backlight dynamic control, that is, the surface light source 10 can be controlled to be bright and dark synchronously with the display screen, thereby achieving the effect of obviously improving the display contrast of the display device to improve the image quality. A distance between adjacent light emitting diode dies in the surface light source in the embodiment is small, which can not only enable a plurality of light emitting diode dies to realize the effect of the surface light source, but also shorten the light mixing height of the surface light source serving as a backlight source, thereby enabling the liquid crystal display device to be ultrathin.

Figure 6:
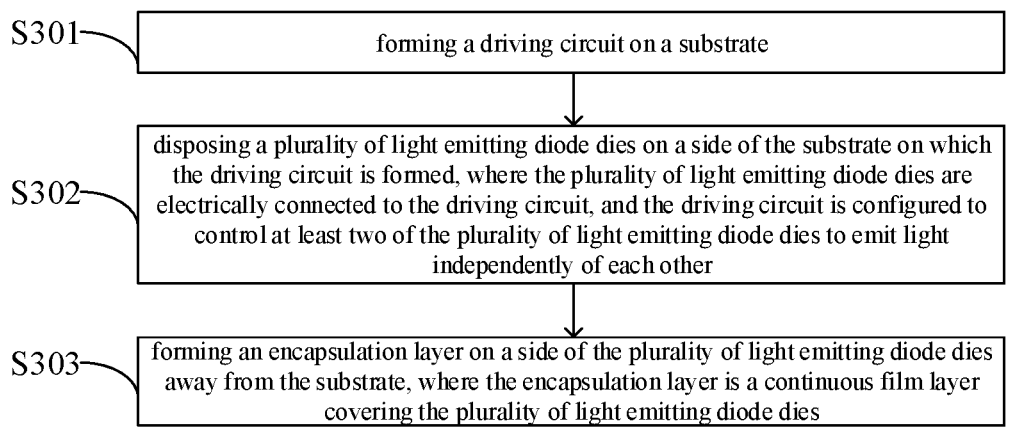
FIG. 6 is a flow chart of a manufacturing method of a surface light source provided by an embodiment of the present disclosure.

For example, another embodiment of the present disclosure provides a manufacturing method of a surface light source. FIG. 6 is a flow chart of a manufacturing method of a surface light source provided by an embodiment of the present disclosure. As illustrated in FIG. 6, the manufacturing method of the surface light source provided by the embodiment includes the following steps.

S301: forming a driving circuit on a substrate;

S302: disposing a plurality of light emitting diode dies on a side of the substrate on which the driving circuit is formed, where the plurality of light emitting diode dies are electrically connected to the driving circuit, and the driving circuit is configured to control at least two of the plurality of light emitting diode dies to emit light independently of each other;

S303: forming an encapsulation layer on a side of the plurality of light emitting diode dies away from the substrate, where the encapsulation layer is a continuous film layer covering the plurality of light emitting diode dies.

The surface light source illustrated in FIG. 1A to FIG. 1C can be prepared by above steps, that is, the surface light source described in the above embodiments can be prepared by the method provided in the embodiment.

The surface light source prepared by the manufacturing method provided by the embodiment can have a smaller light mixing height so that the overall thickness of the surface light source is smaller, and the driving circuit connected with the light emitting diode dies in the surface light source can control the light emitting diode dies to realize dynamic light emission.

For example, each light emitting diode die includes pins, the driving circuit includes pads, the step of disposing the plurality of light emitting diode dies on the side of the substrate on which the driving circuit is formed may include forming an adhesive unit on the pads by dispensing or screen printing, and then placing the pins of the light emitting diode die on the adhesive unit to fix the light emitting diode die on the substrate. For example, the adhesive unit can include solder paste or flux or the like to adhere and electrically connect the pin of the light emitting diode die and the pad of the driving circuit. The embodiment is not limited thereto, the pins of the light emitting diode die can also be electrically connected to the pad of the driving circuit by eutectic soldering.

For example, in another example of the embodiment, before disposing the plurality of light emitting diode dies, the manufacturing method further includes: forming a buffer layer on the side of the substrate on which the driving circuit is formed; forming a plurality of openings in the buffer layer, the plurality of the openings being configured to expose the pads between the buffer layer and the substrate; forming the adhesive unit adhered to the pads in the plurality of openings. And then the step of disposing the plurality of light emitting diode dies includes: inserting the pins of each light emitting diode die into the openings so as to be adhered to the adhesive unit, thereby fixing the light emitting diode die.

The surface light source illustrated in FIG. 3A and FIG. 3B can be prepared by using the above steps.

For example, the opening corresponding to the pad of the driving circuit can be formed in the buffer layer by a photolithography process.

For example, after the opening is formed, the adhesive unit can be formed at the opening, the adhesive unit can be restricted by the opening to prevent it from flowing on the buffer layer. After the adhesive unit is disposed at the opening, the light emitting diode die can be removed from the transfer substrate on which the light emitting diode die is grown by using the mechanical arm, and then the light emitting diode die is placed at the corresponding opening position by the alignment system. In this example, by forming the buffer layer having the opening on the substrate, the precise placement of the light emitting diode dies can be realized, and a problem that the light emitting diode dies move after being placed on the substrate can be solved.

For example, in another example of the embodiment, a reflective layer is further formed on a side of the light emitting diode die facing to the substrate.

For example, the reflective layer can be formed on a side of the substrate away from the light emitting diode die to form the surface light source illustrated in FIG. 4.

For example, the reflective layer can be prepared by chemical or physical method on a surface of the substrate away from the light emitting diode die, for example, a metal layer including materials such as silver/molybdenum or silver can be prepared on the substrate by a sputtering process, or a silver mirror reflective layer can be prepared by a silver ammonia solution.

For example, the reflective layer can be manufactured on the substrate first, and then an integrated circuit controller electrically connected to the drive circuit can be disposed in a region of the substrate where no reflective layer is manufactured (e.g., a side surface of the substrate where no reflective layer is manufactured).

The reflective layer formed on the side of the light emitting diode die facing the substrate in the embodiment enables that the light emitted from the light emitting diode die can be effectively utilized. Compared with a case where no reflective layer is provided, the reflective layer in the surface light source provided by the embodiment can increase the light utilization rate by at least 20%~35%.

The following points need to be explained:

(1) In the drawings of the embodiments of the present disclosure, only the structures related to the embodiments of the present disclosure are involved, and other structures may refer to the common design.

(2) Without conflict, features in the same embodiment and different embodiments of the present disclosure can be combined with each other.

The foregoing is only specific embodiments of the present disclosure, but the protection scope of the present disclosure is not limited thereto. The scope of protection of the present disclosure shall be defined by the claims.

What is claimed is:

1. A surface light source, comprising:
   a substrate;
   a plurality of light emitting diode dies arranged in an array along a row direction and a column direction on the substrate;
   a driving circuit on the substrate and electrically connected to the plurality of light emitting diode dies, each light emitting diode die being an unpackaged die;
   an encapsulation layer on a side of the plurality of light emitting diode dies away from the substrate,
   wherein the encapsulation layer is a continuous film layer covering the plurality of light emitting diode dies,
   in a direction of at least one of the row direction and the column direction, a distance between adjacent ones of the plurality of light emitting diode dies is in a range of 30 µm to 500 µm, and
   in a direction perpendicular to the substrate, a thickness of the encapsulation layer on the side of the plurality of light emitting diode dies away from the substrate is in a range of 10 µm to 30 µm,
   wherein the plurality of light emitting diode dies comprise a plurality of die groups arranged in the row direction and the column direction, the surface light source further comprises a plurality of integrated circuit controllers connected with the driving circuit, each integrated circuit controller is electrically connected to one die group, and the integrated circuit controller electrically connected to each die group is configured to control each light emitting diode die in the each die group to emit light independently,
   wherein the encapsulation layer covers the driving circuit but does not cover the integrated circuit controllers.

2. The surface light source according to claim 1, wherein the encapsulation layer is in direct contact with the plurality of light emitting diode dies.

3. The surface light source according to claim 1, wherein the plurality of light emitting diode dies comprise a plurality of red light dies, a plurality of green light dies and a plurality of blue light dies, and the plurality of red light dies, the plurality of green light dies and the plurality of blue light dies are uniformly distributed to emit white light.

4. The surface light source according to claim 1, wherein the substrate is a glass substrate.

5. The surface light source according to claim 1, wherein each of the plurality of light emitting diode dies comprises pins, and the driving circuit comprises pads, the surface light source further comprises:
   a buffer layer between the substrate and the plurality of light emitting diode dies,
   wherein the buffer layer comprises a plurality of openings configured to expose the pads, and each pin of the plurality of light emitting diode dies is configured to be inserted into one of the plurality of openings so as to be electrically connected with a corresponding one of the pads.

6. The surface light source according to claim 1, wherein a size of each of the plurality of light emitting diode dies in one of the row direction and the column direction is in a range of 30 µm to 200 µm, and a size of each of the plurality of light emitting diode dies in the other one of the row direction and the column direction is in a range of 30 µm to 600 µm.

7. The surface light source according to claim 1, further comprising:
   a reflective layer on a side of the plurality of light emitting diode dies facing the substrate, so that light emitted by the plurality of light emitting diode dies exits to the side of the plurality of light emitting diode dies away from the substrate.

8. A liquid crystal display device, comprising:
   the surface light source according to claim 1; and
   a display panel on a light exiting side of the surface light source,
   wherein the display panel comprises an array substrate and an opposing substrate which are oppositely arranged, and the surface light source is on a side of the array substrate away from the opposing substrate.

9. A manufacturing method of a surface light source, comprising:
- forming a driving circuit on a substrate;
- disposing a plurality of light emitting diode dies on a side of the substrate on which the driving circuit is formed, wherein the plurality of light emitting diode dies are electrically connected to the driving circuit, the driving circuit is configured to control at least two of the plurality of light emitting diode dies to emit light independently of each other, and each light emitting diode die is an unpackaged die; and
- forming an encapsulation layer on a side of the plurality of light emitting diode dies away from the substrate, wherein the encapsulation layer is a continuous film layer covering the plurality of light emitting diode dies, wherein
- in a direction of at least one of the row direction and the column direction, a distance between adjacent ones of the plurality of light emitting diode dies is in a range of 30 μm to 500 μm, and
- in a direction perpendicular to the substrate, a thickness of the encapsulation layer on the side of the plurality of light emitting diode dies away from the substrate is less than 30 μm,
- wherein the plurality of light emitting diode dies comprise a plurality of die groups arranged in the row direction and the column direction, the surface light source further comprises a plurality of integrated circuit controllers connected with the driving circuit, each integrated circuit controller is electrically connected to one die group, and the integrated circuit controller electrically connected to each die group is configured to control each light emitting diode die in the each die group to emit light independently,
- wherein the encapsulation layer covers the driving circuit but does not cover the integrated circuit controllers.

10. The manufacturing method according to claim 9, wherein the driving circuit comprises pads, each of the plurality of light emitting diode dies comprises pins, before disposing the plurality of light emitting diode dies, the manufacturing method further comprises:
- forming a buffer layer on the side of the substrate on which the driving circuit is formed;
- forming a plurality of openings in the buffer layer, the plurality of the openings being configured to expose the pads between the buffer layer and the substrate;
- forming adhesive units adhered to the pads in the plurality of openings;
- disposing the plurality of light emitting diode dies comprises:
- inserting the pins of each of the plurality of light emitting diode dies into the plurality of openings so as to be adhered to the adhesive units.

11. The surface light source according to claim 1, wherein the driving circuit is configured to control at least two of the plurality of light emitting diode dies to emit light independently of each other.

12. The surface light source according to claim 5, wherein the buffer layer comprises a mixture of at least an organic substance and a photo-initiator, and the organic substance includes propyl acetate or siloxane.

13. The manufacturing method according to claim 10, wherein the buffer layer comprises a mixture of at least an organic substance and a photo-initiator, and the organic substance includes propyl acetate or siloxane.

* * * * *